United States Patent
Kang et al.

(10) Patent No.: US 9,557,446 B2
(45) Date of Patent: Jan. 31, 2017

(54) BLACK PHOTOSENSITIVE RESIN COMPOSITION, PHOTOSENSITIVE RESIN LAYER, AND DISPLAY DEVICE COMPRISING THE SAME

(71) Applicant: Samsung SDI Co., Ltd., Yongin-si (KR)

(72) Inventors: Heekyoung Kang, Suwon-si (KR); Jinhee Kang, Suwon-si (KR); Bumjin Lee, Suwon-si (KR); Sang Soo Kim, Suwon-si (KR); Chanwoo Kim, Suwon-si (KR); Sungseo Cho, Suwon-si (KR); Chungbeum Hong, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 15/053,032

(22) Filed: Feb. 25, 2016

(65) Prior Publication Data

US 2016/0377765 A1    Dec. 29, 2016

(30) Foreign Application Priority Data

Jun. 25, 2015  (KR) .......... 10-2015-0090644

(51) Int. Cl.
| | |
|---|---|
| *G03F 7/038* | (2006.01) |
| *G02B 1/04* | (2006.01) |
| *G03F 7/039* | (2006.01) |
| *G03F 7/00* | (2006.01) |
| *G02B 5/00* | (2006.01) |

(52) U.S. Cl.
CPC ............... *G02B 1/04* (2013.01); *G02B 5/003* (2013.01); *G03F 7/0007* (2013.01); *G03F 7/039* (2013.01); *G03F 7/0387* (2013.01)

(58) Field of Classification Search
CPC ...... C08L 79/08; C08L 79/085; G03F 7/0007; G03F 7/0387; G03F 7/037; G03F 7/028; G03F 7/031; G03F 7/0384; G03F 7/0388; G02F 1/133514; G02B 5/20; G02B 5/223; G02B 5/003
USPC ............. 430/7, 281.1, 286.1, 287.1; 349/110
See application file for complete search history.

(56) References Cited

FOREIGN PATENT DOCUMENTS

| | | |
|---|---|---|
| JP | 2002-047423 A | 2/2002 |
| JP | 2006-342310 A | 12/2006 |
| JP | 2008-297231 A | 12/2008 |
| JP | 4678142 B2 | 4/2011 |
| KR | 10-0731327 | 6/2007 |
| KR | 10-1392167 | 5/2014 |
| KR | 10-2014-0073277 | 6/2014 |
| KR | 10-1507607 | 3/2015 |
| TW | 201423270 | 6/2014 |
| WO | WO 2014/194631 A1 * | 12/2014 |

OTHER PUBLICATIONS

Computer-generated translation of WO 2014/194631 (Dec. 2014).*
Search Report in counterpart Taiwanese Application No. 105107988 dated Oct. 18, 2016, pp. 1.

* cited by examiner

*Primary Examiner* — John A McPherson
(74) *Attorney, Agent, or Firm* — Additon, Higgins & Pendleton, P.A.

(57) ABSTRACT

A black photosensitive resin composition includes (A) an alkali soluble polyimide-polyamic acid copolymerization resin; (B) a multi-functional monomer; (C) a photopolymerization initiator; (D) a black colorant; and (E) a solvent, a photosensitive resin layer manufactured using the same, and a display device including the photosensitive resin layer.

12 Claims, No Drawings

BLACK PHOTOSENSITIVE RESIN COMPOSITION, PHOTOSENSITIVE RESIN LAYER, AND DISPLAY DEVICE COMPRISING THE SAME

CROSS-REFERENCE TO RELATED APPLICATION

This application claims priority to and the benefit of Korean Patent Application No. 10-2015-0090644 filed in the Korean Intellectual Property Office on Jun. 25, 2015, the entire disclosure of which is incorporated herein by reference.

FIELD

This disclosure relates to a black photosensitive resin composition, a photosensitive resin layer using the same, and a display device including the photosensitive resin layer.

BACKGROUND

A black photosensitive resin composition is used to manufacture a light blocking layer of a display device for a color filter, a liquid crystal display material, an organic light emitting element (EL), a display panel material, and the like. For example, a color filter such as a color liquid crystal display and the like needs a light blocking layer on the border among colored layers such as red, green, blue, and the like to enhance display contrast or chromophore effects. This light blocking layer may be mainly formed of a black photosensitive resin composition including a black pigment. Currently, carbon black is the most widely used black pigment, but RGB-mixed black, a perylene-based compound, cobalt oxide, lactam-based organic black, and the like may also be used.

A light-blocking layer inside a device such as a display device and the like can be formed by patterning a composition including a cardo binder resin or an acrylic binder resin through a process such as exposure, development, and the like. The pattern, however, may rarely be uniform and fine, and can easily collapse due to low heat resistance and a low tapered angle.

Accordingly, there is a need for a light-blocking layer composition including a binder resin having high heat resistance characteristics and a display device including a light-blocking layer formed using the light-blocking layer composition.

SUMMARY OF THE INVENTION

One embodiment provides a black photosensitive resin composition that can have excellent heat resistance and taper characteristics.

Another embodiment provides a photosensitive resin layer manufactured using the black photosensitive resin composition.

Yet another embodiment provides a display device including the photosensitive resin layer.

One embodiment provides a black photosensitive resin composition including (A) an alkali soluble polyimide-polyamic acid copolymerization resin; (B) a multi-functional monomer; (C) a photopolymerization initiator; (D) a black colorant; and (E) a solvent.

The copolymerization resin may have an unsaturated double bond at least one terminal end.

The unsaturated double bond may be derived from a compound selected from Chemical Formula 1 to Chemical Formula 4.

[Chemical Formula 1]
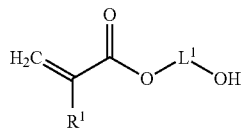

[Chemical Formula 2]
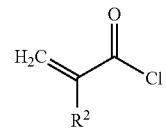

[Chemical Formula 3]
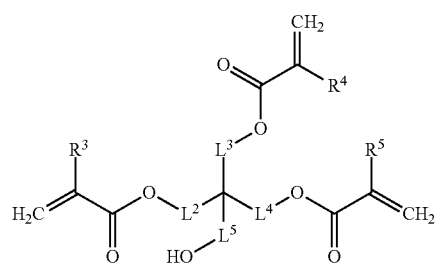

[Chemical Formula 4]
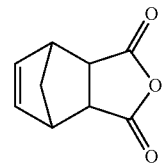

In Chemical Formula 1 to Chemical Formula 3, $R^1$ to $R^5$ are the same or different and are each independently a hydrogen atom or a substituted or unsubstituted C1 to C10 alkyl group, and $L^1$ to $L^5$ are the same or different and are each independently a single bond or a substituted or unsubstituted C1 to C10 alkylene group.

The copolymerization resin may include polyimide and polyamic acid in a mole ratio of about 1:99 to about 95:5.

The copolymerization resin may include polyimide and polyamic acid in a mole ratio of about 40:60 to about 60:40.

The copolymerization resin may be represented by Chemical Formula 5.

[Chemical Formula 5]

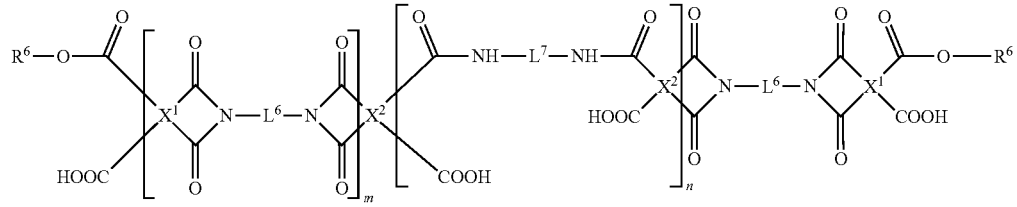

In Chemical Formula 5, $X^1$ and $X^2$ are the same or different and are each independently a substituted or unsubstituted tetravalent alicyclic organic group or a substituted or unsubstituted tetravalent aromatic organic group, $L^6$ and $L^7$ are the same or different and are each independently a single bond, a substituted or unsubstituted C1 to C10 alkylene group, a substituted or unsubstituted C3 to C10 cycloalkylene group, or a substituted or unsubstituted C6 to C20 arylene group, each $R^6$ is the same or different and each is independently a substituted or unsubstituted acrylic group, a substituted or unsubstituted methacrylic group or a substituted or unsubstituted norbornene group, and m and n are the same or different and are each independently an integer ranging from 1 to 100,000.

The copolymerization resin may have a weight average molecular weight of about 3,000 g/mol to about 100,000 g/mol.

The copolymerization resin may be mixed with another alkali soluble resin, wherein the alkali soluble resin may include a novolac resin, a bisphenol A resin, a bisphenol F resin, an acrylic-based resin, a silanol group-containing resin, a silsesquioxane-containing resin, or a combination thereof.

The black colorant may include an aniline black pigment, a perylene black pigment, a titanium black pigment, a cyanine black pigment, a lignin black pigment, a lactam-based organic black pigment, a RGB black pigment, a carbon black pigment, a black dye, or a combination thereof.

The black photosensitive resin composition may further include a photosensitizer.

The black photosensitive resin composition may include about 1 parts by weight to about 100 parts by weight of (B) the multi-functional monomer, about 0.1 parts by weight to about 100 parts by weight of (C) the photopolymerization initiator, about 10 parts by weight to about 400 parts by weight of (D) the black colorant and about 100 parts by weight to about 5000 parts by weight of (E) the solvent based on about 100 parts by weight of the (A) copolymerization binder resin.

The black photosensitive resin composition may further include an additive of malonic acid, 3-amino-1,2-propanediol, a silane-based coupling agent, a leveling agent, a fluorine-based surfactant, a radical polymerization initiator, or a combination thereof.

Another embodiment provides a photosensitive resin layer manufactured using the photosensitive resin composition.

Yet another embodiment provides a display device including the photosensitive resin layer.

Other embodiments of the present invention are included in the following detailed description.

A photosensitive resin composition according to one embodiment may improve heat resistance and taper characteristics by using a polyimide-polyamic acid copolymerization resin as an alkali soluble resin.

DETAILED DESCRIPTION

Hereinafter, embodiments of the present invention are described in detail. However, these embodiments are exemplary, the present invention is not limited thereto and the present invention is defined by the scope of claims.

As used herein, when a specific definition is not otherwise provided, the term "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C3 to C20 heterocycloalkenyl group, the term "aryl group" refers to a C6 to C20 aryl group, the term "arylalkyl group" refers to a C6 to C20 arylalkyl group, the term "alkylene group" refers to a C1 to C20 alkylene group, the term "arylene group" refers to a C6 to C20 arylene group, the term "alkylarylene group" refers to a C6 to C20 alkylarylene group, the term "heteroarylene group" refers to a C3 to C20 heteroarylene group, and the term "alkoxylene group" refers to a C1 to C20 alkoxylene group.

As used herein, when a specific definition is not otherwise provided, the term "substituted" refers to one substituted with a substituent selected from a halogen atom (F, Cl, Br, I), a hydroxy group, a 01 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a 01 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof instead of at least one hydrogen.

As used herein, when a specific definition is not otherwise provided, the term "hetero" refers to one including at least one heteroatom selected from N, O, S and P in a chemical formula.

As used herein, when a specific definition is not otherwise provided, the term "aliphatic organic group" may refer to a C1 to C30 alkyl group, a C2 to C30 alkenyl group, a C2 to C30 alkynyl group, a C1 to C30 alkylene group, a C2 to C30 alkenylene group, or a C2 to C30 alkynylene group, for example a C1 to C20 alkyl group, a C2 to C20 alkenyl group, a C2 to C20 alkynyl group, a C1 to C20 alkylene group, a C2 to C20 alkenylene group, or a C2 to C20 alkynylene group; the term "alicyclic organic group" may refer to a C3 to C30 cycloalkyl group, a C3 to C30 cycloalkenyl group, a C3 to C30 cycloalkynyl group, a C3 to C30 cycloalkylene group, a C3 to C30 cycloalkenylene group, or a C3 to C30 cycloalkynylene group, for example a C3 to C20 cycloalkyl group, a C3 to C20 cycloalkenyl group, a C3 to C20 cycloalkynyl group, a C3 to C20 cycloalkylene group, a C3 to C20 cycloalkenylene group, or a C3 to C20 cycloalkynylene group; and the term "aromatic organic group" may refer to a C6 to C30 aryl group, a C2 to C30 heteroaryl group, a C6 to C30 arylene group, or a C2 to C30 heteroarylene group, for example a C6 to C16 aryl group, a C2 to C16 heteroaryl group, a C6 to C16 arylene group, or a C2 to C16 heteroarylene group.

As used herein, when a specific definition is not otherwise provided, "(meth)acrylate" refers to both "acrylate" and "methacrylate", and "(meth)acrylic acid" refers to "acrylic acid" and "methacrylic acid".

As used herein, when a specific definition is not otherwise provided, the term "combination" refers to mixing or copolymerization.

As used herein, when a specific definition is not otherwise provided, "*" indicates a point linked to the same or different atom or chemical formula.

A black photosensitive resin composition according to one embodiment includes (A) an alkali soluble polyimide-polyamic acid copolymerization resin; (B) a multi-functional monomer; (C) a photopolymerization initiator; (D) a black colorant; and (E) a solvent.

A black photosensitive resin composition can include a cardo-based binder resin as the alkali soluble resin to secure heat resistance but it can be difficult to secure the heat resistance up to a desired level. Alternatively, a black photosensitive resin composition including an alkali soluble resin such as polyimide, a polybenzooxazole precursor, and the like to secure high heat resistance can have a problem wherein a pattern flows down after the curing and can have a low tapered angle.

However, a black photosensitive resin composition according to one embodiment uses a polyimide-polyamic acid copolymerization resin as the alkali soluble resin and thus may show appropriate optical density when used to form a photosensitive resin layer and can maintain excellent heat resistance at greater than or equal to about 350° C. without delaminating a pixel when processed into a pattern. Accordingly, the photosensitive resin layer may be used as a protective layer and/or an insulation layer during a display-manufacture process, a light leakage-blocking layer, a support spacer for maintaining a cell gap, and the like, without limitation.

In addition, the photosensitive resin layer may be used as a substrate between a glass and an active layer or a gate electrode due to high heat resistance properties.

Hereinafter, each component of the black photosensitive resin composition is described in detail.

(A) Alkali Soluble Polyimide-Polyamic Acid Copolymerization Resin

A black photosensitive resin composition according to one embodiment includes an alkali soluble resin, and the alkali soluble resin includes a polyimide-polyamic acid copolymerization resin.

According to one embodiment, the alkali soluble resin of the black photosensitive resin composition simultaneously has a polyimide unit having solubility in an organic solvent and a polyamic acid unit having a polyimide precursor structure and may provide a photosensitive resin layer having high heat resistance, for example, a high heat-resistant light-blocking layer, which has hardly been conventionally realized.

In order to prevent over-dissolution characteristics of the polyamic acid as a polyimide precursor in an alkali aqueous solution, a photosensitive resin layer, for example, a light-blocking layer having excellent heat resistance and pattern-forming capability may be realized by copolymerizing polyimide as the main structure of a polymer and adjusting dissolution and thus obtaining an appropriate solubility difference between an exposed region and a non-exposed region during a patterning process.

The copolymerization resin may have an unsaturated double bond at at least one terminal end, for example, at both terminal ends. The unsaturated double bond may also be present in the middle of a chain of the copolymerization resin in addition to or instead of one or both terminal ends of the copolymerization resin. The unsaturated double bond at the terminal end (and/or in the middle of a chain) may work as a cross-linking functional group and thus can improve the cross-linking characteristics of the copolymerization resin. In other words, a photosensitive resin composition having a much excellent contrast may be realized by introducing a monomer cross-linked by a photoinitiator at the terminal end (and/or in the middle of a chain) of a main structure in order to apply cross-linking characteristics due to exposure of the copolymerization resin itself, and the monomer cross-linked by the photoinitiator may be represented by one or more compounds selected from Chemical Formulae 1 to 4.

For example, the unsaturated double bond may be derived from one or more compounds selected from Chemical Formulae 1 to 4, but is not limited thereto.

[Chemical Formula 1]
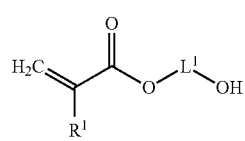

[Chemical Formula 2]
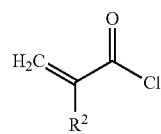

[Chemical Formula 3]
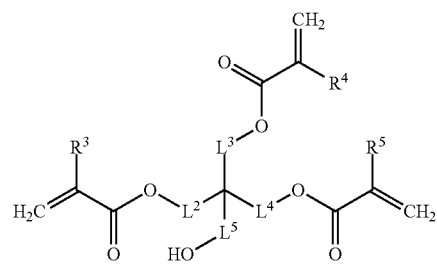

[Chemical Formula 4]
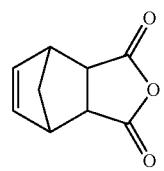

In Chemical Formula 1 to Chemical Formula 3, $R^1$ to $R^5$ are the same or different and are each independently a hydrogen atom or a substituted or unsubstituted C1 to C10 alkyl group, and $L^1$ to $L^5$ are the same or different and are each independently a single bond or a substituted or unsubstituted C1 to C10 alkylene group.

The copolymerization resin may include the polyimide and polyamic acid in a mole ratio of about 1:99 to about 95:5, for example about 40:60 to about 60:40.

When the polyimide and polyamic acid satisfy the above mole ratio range in the copolymerization resin, the copolymerization resin may have excellent cross-linking characteristics. In contrast, when the polyimide and polyamic acid are used in amounts outside of the above range in the copolymerization resin, properties of the composition can deteriorate. For example, developability of the composition may be deteriorated if the polyimide is present in too large an amount and developability of the composition can become too excellent, and pattern-forming capability may be largely deteriorated if the polyamic acid is present in too large an amount.

In other words, the copolymerization resin may easily adjust solubility of a photosensitive resin itself in an alkali aqueous solution by controlling a mole ratio of a polyimide unit having an imidized structure in a solution state. In this way, a fine pattern having appropriate solubility in an alkali aqueous solution by adjusting a copolymerization ratio of an alkali soluble imide structure and a polyamic acid structure as a polyimide precursor is formed through a development process by introducing a cross-linking functional group at the terminal end (and/or in the middle of a chain) of the copolymerization resin to cross-link an exposure region during the UV radiation, and excellent heat resistance may be obtained by thermally curing the fine pattern at greater than or equal to about 350° C.

For example, the copolymerization resin may be represented by Chemical Formula 5, but is not limited thereto.

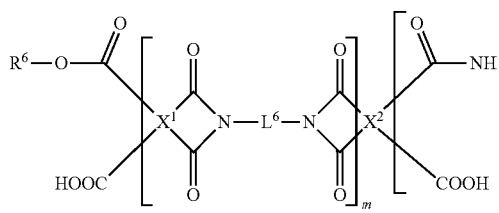

[Chemical Formula 5]

In Chemical Formula 5, $X^1$ and $X^2$ are the same or different and are each independently a substituted or unsubstituted tetravalent alicyclic organic group or a substituted or unsubstituted tetravalent aromatic organic group, $L^6$ and $L^7$ are the same or different and are each independently a single bond, a substituted or unsubstituted C1 to C10 alkylene group, a substituted or unsubstituted C3 to C10 cycloalkylene group, or a substituted or unsubstituted C6 to C20 arylene group, each $R^6$ is the same or different and each is independently a substituted or unsubstituted acrylic group, a substituted or unsubstituted methacrylic group or a substituted or unsubstituted norbornene group, and m and n are the same or different and are each independently an integer ranging from 1 to 100,000.

The tetravalent aromatic organic group may be represented by Chemical Formula 6.

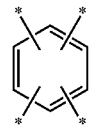

[Chemical Formula 6]

The C6 to C20 arylene group may include a linking group represented by Chemical Formula 7.

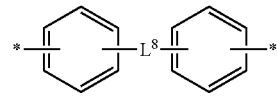

[Chemical Formula 7]

In Chemical Formula 7, $L^8$ is a substituted or unsubstituted C1 to C8 alkylene group.

The copolymerization resin may have a weight average molecular weight of about 3,000 g/mol to about 100,000 g/mol. When the copolymerization resin has a weight average molecular weight within the above range, pattern-forming capability can be improved and the resultant thin film may have excellent mechanical thermal characteristics.

The copolymerization resin may be mixed with another alkali soluble resin.

Examples of the another alkali soluble resin may include without limitation a novolac resin, a bisphenol A resin, a bisphenol F resin, an acrylic-based resin, a silanol group-containing resin, a silsesquioxane-containing resin, and the like and combinations thereof.

The bisphenol A resin may be, for example, a bisphenol A epoxy resin that is represented by Chemical Formula 8, but is not limited thereto.

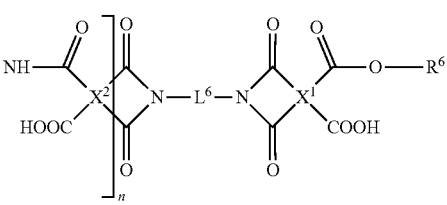

[Chemical Formula 8]

In Chemical Formula 8, $R^a$ to $R^d$ are the same or different and are each independently a hydrogen atom or a substituted or unsubstituted C1 to C10 alkyl group.

The bisphenol F resin may be, for example, bisphenol F epoxy resin that is represented by Chemical Formula 9, but is not limited thereto.

[Chemical Formula 9]

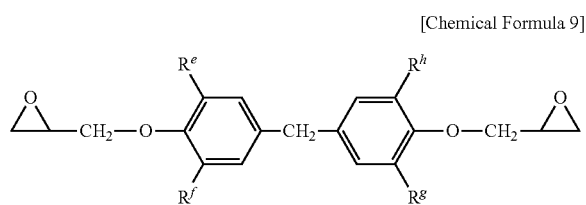

In Chemical Formula 9, $R^e$ to $R^h$ are the same or different and are each independently a hydrogen atom or a substituted or unsubstituted C1 to C10 alkyl group.

(B) Multi-Functional Monomer

The multi-functional monomer forms a photoresist by light radiation, and can be a multi-functional ester of (meth) acrylic acid including at least one ethylenic unsaturated double bond.

The multi-functional monomer has the ethylenic unsaturated double bond and thus, may cause sufficient polymerization during exposure in a pattern-forming process and form a pattern having excellent heat resistance, light resistance, and chemical resistance.

Examples of the multi-functional monomer may include without limitation one or more of propylene glycol methacrylate, dipentaerythritol hexaacrylate, dipentaerythritol acrylate, neopentylglycol diacrylate, 1,6-hexanediol diacrylate, 1,6-hexanediol acrylate tetraethylene glycol methacrylate, bisphenoxy ethylalcohol diacrylate, trishydroxyethylisocyanurate trimethacrylate, trimethylpropane trimethacrylate, pentaerythritol trimetacrylate, pentaerythritol tetramethacrylate, pentaerythritol hexametacrylate, and the like, and combinations thereof.

Commercially available examples of the multi-functional monomer include the following. Examples of a difunctional (meth)acrylic acid ester may include without limitation Aronix M-210®, M-240®, and/or M-6200® (Toagosei Chemistry Industry Co., Ltd.), KAYARAD HDDA®, HX-220®, and/or R-604® (Nippon Kayaku Co., Ltd.), V-260®, V-312®, and/or V-335 HP® (Osaka Organic Chemical Ind., Ltd.), and the like. Examples of a trifunctional (meth)acrylic acid ester may include without limitation Aronix M-309®, M-400®, M-405®, M-450®, M-710®, M-8030®, and/or M-8060® (Toagosei Chemistry Industry Co., Ltd.), KAYARAD TMPTA®, DPCA-20®, DPCA-30®, DPCA-60®, and/or DPCA-120® (Nippon Kayaku Co., Ltd.), V-295®, V-300®, V-360®, V-GPT®, V-3PA®, and/or V-400® (Osaka Yuki Kayaku Kogyo Co. Ltd.), and the like. These may be used singularly or as a mixture of two or more.

The multi-functional monomer may be treated with acid anhydride to improve developability.

The multi-functional monomer may be included in an amount of about 1 part by weight to about 100 parts by weight, for example about 20 parts by weight to about 80 parts by weight, and as another example about 50 parts by weight to about 75 parts by weight, based on about 100 parts by weight of the copolymerization resin. In some embodiments, the black photosensitive resin composition may include the multi-functional monomer in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of the multi-functional monomer can be in a range from about any of the foregoing amounts to about any other of the foregoing amounts.

When the multi-functional monomer is included in an amount within the above range, pattern-forming capabilities can be improved due to a cross-linking bond by a radical reaction of a post-described photopolymerization initiator by UV radiation, and a bonding force with the particle components such as black colorants and the like, increasing an optical density. In addition, curing by exposure can occur sufficiently during a pattern-forming process, and developability by an alkali developing solution can be improved.

(C) Photopolymerization Initiator

The photopolymerization initiator may be a generally-used initiator in a photosensitive resin composition. Examples of the photopolymerization initiator can include without limitation acetophenone-based compounds, benzophenone-based compounds, thioxanthone-based compounds, benzoin-based compounds, triazine-based compounds, oxime-based compounds, and the like, and combinations thereof.

Examples of the acetophenone-based compound may include without limitation 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound may include without limitation benzophenone, benzoyl benzoate, benzoyl benzoate methyl, 4-phenyl benzophenone, hydroxy benzophenone, acrylated benzophenone, 4,4'-bis(dimethyl amino)benzophenone, 4,4'-bis(diethylamino)benzophenone, 4,4'-dimethylam inobenzophenone, 4,4'-dichlorobenzophenone, 3,3'-dimethyl-2-methoxybenzophenone, and the like, and combinations thereof.

Examples of the thioxanthone-based compound may include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl-4,6-bis(trichloro methyl)-s-triazine, bis(trichloromethyl)-6-styryl-s-triazine, 2-(naphtho1-yl)-4,6-bis(trichloromethyl)-s-triazine, 2-(4-methoxynaphtho1-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like, and combinations thereof.

Examples of the oxime-based compound may be include without limitation O-acyloxime-based compounds, 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethanone, O-ethoxycarbonyl-α-oxyamino-1- phenylpropan-1-one, and the like, and combinations thereof. Examples of the O-acyloxime-based compound may include without limitation 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione2-oxime-O-benzoate, 1-(4-phenylsulfanyl phenyl)-octane-1,2-dione2-oxime-O-benzoate, 1-(4-phenylsulfanyl phenyl)-octan-1-oneoxime-O-acetate, 1-(4-phenylsulfanyl phenyl)-butan-1-oneoxime-O-acetate, and the like, and combinations thereof.

The photopolymerization initiator may further include a carbazole-based compound, a diketone-based compound, a sulfonium borate-based compound, a diazo-based compound, an imidazole-based compound, a biimidazole-based compound, and the like, in addition to or instead of the foregoing compounds.

The photopolymerization initiator may be used with a photosensitizer capable of causing a chemical reaction by absorbing light and becoming excited and then, transferring its energy. That is, the black photosensitive resin composition may further include a photosensitizer.

Examples of the photosensitizer may include without limitation tetraethylene glycol bis-3-mercapto propionate, pentaerythritol tetrakis-3-mercapto propionate, dipentaerythritol tetrakis-3-mercapto propionate, and the like, and combinations thereof.

The (C) photopolymerization initiator may be included in an amount of about 0.1 parts by weight to about 100 parts by weight, for example about 5 parts by weight to about 20 parts by weight, and as another example about 10 parts by weight to about 20 parts by weight, based on about 100 parts by weight of the copolymerization resin. In some embodiments, the black photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of the photopolymerization initiator can be in a range from about any of the foregoing amounts to about any other of the foregoing amounts.

When the (C) photopolymerization initiator is included in an amount within the above range, excellent reliability may be secured due to sufficiently curing during exposure in a pattern-forming process, a pattern may have excellent resolution and close contacting (adhesive) property as well as excellent heat resistance, light resistance, and chemical resistance, and transmittance may be prevented from deterioration due to a non-reaction initiator.

(D) Black Colorant

A black photosensitive resin composition according to one embodiment includes a black colorant, and the black colorant may be, for example a pigment, a dye, or a combination thereof.

The pigment may be used in a form of pigment dispersion, and the pigment dispersion can include a solid pigment, a dispersing agent, and a solvent. Herein, the solid pigment may be included in an amount of about 8 wt % to about 30 wt %, for example about 8 wt % to about 15 wt %, and as another example about 8 wt % to about 12 wt %, based on the total amount (total weight, 100 wt %) of the pigment dispersion. In this case, the pigment may be effectively dispersed, dispersion stability may be ensured, and color characteristics such as luminance and the like may be improved.

The black pigment may be an inorganic black pigment, an organic black pigment, or a combination thereof. Examples of the black pigment may include without limitation aniline black, perylene black, titanium black, cyanine black, lignin black, lactam-based organic black, RGB black, carbon black, and the like, and combinations thereof. For example, the organic black pigment may be lactam-based organic black represented by the following Chemical Formula A.

[Chemical Formula A]

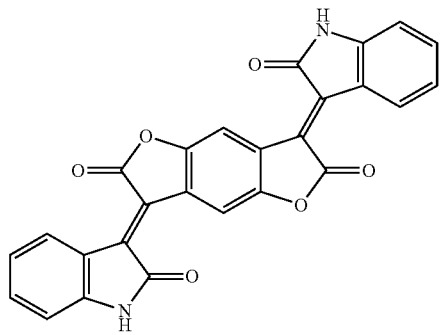

The RGB black may be at least two of colored pigments such as a red pigment, a green pigment, a blue pigment, a violet pigment, a yellow pigment, a purple pigment, and the like.

When the black pigment includes carbon black, light-blocking properties, surface smoothness, dispersion stability, and compatibility with the binder resin may be improved. In case of the black pigment, a color calibrator such as an anthraquinone-based pigment, a perylene-based pigment, a phthalocyanine-based pigment, an azo-based pigment and the like may be used.

The black pigment may have a primary particle diameter of about 10 nm to about 80 nm, for example about 10 nm to about 70 nm. When the primary particle diameter has a particle diameter within the above range, stability in the pigment dispersion can be improved, and resolution of pixels may not be deteriorated.

Examples of the solvent of the pigment dispersion may include without limitation ethylene glycol acetate, ethyl cellosolve, propylene glycol monomethyl ether acetate, ethyl lactate, polyethylene glycol, cyclohexanone, propylene glycol methyl ether or 3-methoxy-1-butanol, and the like, and combinations thereof. In exemplary embodiments, the solvent may include propylene glycol monomethyl ether acetate. Herein, the amount of the solvent may be adjusted so that a solid content of the pigment dispersion may be about 5 wt % to about 30 wt %, but is not limited thereto.

The solvent may be included in a balance amount in the pigment dispersion, for example about 30 wt % to about 90 wt %, for example about 40 wt % to about 90 wt %, for example about 50 wt % to about 90 wt %, for example about 60 wt % to about 90 wt %, for example about 70 wt % to about 90 wt %, for example about 80 wt % to about 90 wt %.

The pigment dispersion may further include a dispersing agent. The dispersing agent may include a non-ionic, anionic and/or cationic dispersing agent. Examples of the dispersing agent can include without limitation polyalkylene glycols and esters thereof, polyoxyalkylenes, polyhydric alcohol ester alkylene oxide addition products, alcohol alkylene oxide addition products, sulfonate esters, sulfonate salts, carboxylate esters, carboxylate salts, alkyl amide alkylene oxide addition products, alkylamines, and the like. The dispersing agent may be used singularly or as a mixture of two or more.

Examples of the black pigment may include without limitation BK-6912, BK-6913, and/or BK-6616 made by Tokushiki Co. Ltd.; TCD-006H made by Nippon Steel Corporation; CI-M 390, CI-M 391, CI-M 395, CI-M 400, CI-M 402, and/or CI-M 408 made by Sakata; and the like, and combinations thereof.

Examples of the black dye may include without limitation acridine dyes, anthraquinone dyes, arylmethane dyes, diarylmethane dyes, triarylmethane dyes, azo dyes, diazonium dyes, nitro dyes, nitroso dyes, phthalocyanine dyes, quinone-imine dyes, azine dyes, eurhodin dyes, safranin dyes, indamin dyes, indophenol dyes, oxazine dyes, oxazone dyes, thiazin dyes, thiazole dyes, xanthene dyes, fluorene dyes, pyronin dyes, rhodamine dyes, and the like, and combinations thereof.

The black colorant may include the black pigment and the black dye. In embodiments, an amount of the black pigment in the black colorant may be greater than that of the black dye. Herein, a black photosensitive resin composition including the black colorant may have improved heat resistance.

The black colorant may be included in an amount of about 10 parts by weight to about 400 parts by weight, for example about 50 parts by weight to about 400 parts by weight, based on about 100 parts by weight of the copolymerization resin. In some embodiments, the black photosensitive resin composition may include the black colorant in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 384, 385, 386, 387, 388, 389, 390, 391, 392, 393, 394, 395, 396, 397, 398, 399, or 400 parts by weight. Further, according to some embodiments of the present invention, the amount of the black colorant can be in a range from about any of the foregoing amounts to about any other of the foregoing amounts.

When the black colorant is present in an amount within the above range, color characteristics such as luminance and the like and developability may be improved.

(E) Solvent

The solvent is a material having compatibility with the copolymerization resin, the multi-functional monomer, the photopolymerization initiator, and the black colorant but not reacting therewith.

Examples of the solvent may include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone and the like; saturated aliphatic monocarboxylic acid alkyl esters such as ethyl acetate, n-butyl acetate, isobutyl acetate, and the like; lactate esters such as methyl lactate, ethyl lactate, and the like; oxy acetic acid alkyl esters such as oxy methyl acetate, oxy ethyl acetate, butyl oxyacetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such as 2-oxy-2-methyl methyl propionate, 2-oxy-2-methyl ethyl propionate, and the like, monooxy monocarboxylic acid alkyl esters of 2-alkoxy-2-methyl alkyl propionates such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; ketonate esters such as ethyl pyruvate, and the like, and combinations thereof. Additionally, high boiling point solvents such as but not limited N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like, and combinations thereof may be also used.

Considering miscibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol monomethylether acetate, propylene glycol propylether acetate and the like may be used.

The solvent may be included in an amount of about 100 parts by weight to about 5000 parts by weight based on about 100 parts by weight of the copolymerization resin. When the solvent is included in an amount within the above range, the black photosensitive resin composition may have an appropriate viscosity resulting in improvement of coating characteristics of a black matrix.

(F) Other Additive(s)

The photosensitive resin composition may further include one or more other additives such as but not limited to malonic acid, 3-amino-1,2-propanediol, or a vinyl- or (meth) acryloxy-containing silane-based coupling agent, a leveling agent, a surfactant, a radical polymerization initiator, or a combination thereof in order to prevent stains or spots during the coating, to improve leveling performance, and/or to prevent pattern residues due to non-development.

Examples of the silane-based coupling agent may include without limitation trimethoxysilyl benzoic acid, γ-methacryl oxypropyl trimethoxysilane, vinyl triacetoxysilane, vinyl trimethoxysilane, γ-iso cyanate propyl triethoxysilane, γ-glycidoxy propyl trimethoxysilane, β-(3,4-epoxycyclohexyl)ethyltrimethoxysilane and the like, and these may be used singularly or in a mixture of two or more.

The surfactant may be a fluorine-based surfactant. Examples of the fluorine-based surfactant may without limitation a commercial fluorine-based surfactant such as BM-1000® and/or BM-1100® (BM Chemie Inc.); MEGAFACE F 142D®, F 172®, F 173®, and/or F 183® (Dainippon Ink Kagaku Kogyo Co., Ltd.); FULORAD FC-135®, FULORAD FC-170C®, FULORAD FC-430®, and/or FULORAD FC-431® (Sumitomo 3M Co., Ltd.); SURFLON S-112®, SURFLON 5-113®, SURFLON S-131®, SURFLON S-141®, and/or SURFLON S-145® (Asahi Glass Co., Ltd.); SH-28PA®, SH-190®, SH-193®, SZ-6032®, and/or SF-8428® (Toray Silicone Co., Ltd.) and the like, and combinations thereof.

These additives may be adjusted in an amount depending on desired properties.

The photosensitive resin composition may further include an epoxy compound to improve the close contacting (adhesive) properties with a substrate.

Examples of the epoxy compound may include without limitation phenol novolac epoxy compounds, tetramethyl biphenyl epoxy compounds, bisphenol A epoxy compounds, alicyclic epoxy compounds, and the like, and combinations thereof.

The epoxy compound may be included in an amount of about 0.01 parts by weight to about 5 parts by weight, for example about 0.1 parts by weight to about 5 parts by weight, based on about 100 parts by weight of the photosensitive resin composition. When the epoxy compound is included in an amount within the above range, a close contacting property, heat resistance and chemical resistance can be improved.

Photosensitive resin compositions can be classified as a positive type dissolved in an exposed part or as a negative type cured and left in the exposed part during development. The black photosensitive resin composition may be a negative black photosensitive resin composition. When a photosensitive resin layer, for example a light-blocking layer, is formed using the photosensitive resin composition including the black colorant, the positive type decreases transmittance of ultraviolet (UV) and thus a fine pattern may not be obtained.

Another embodiment provides a photosensitive resin layer manufactured using the photosensitive resin composition.

The photosensitive resin layer may be, for example a light-blocking layer.

Another embodiment provides a display device including the photosensitive resin layer.

The black light-locking layer may be manufactured as follows.

The photosensitive resin composition can be coated to form an about 0.5 µm to about 10 µm-thick resin composition layer on a glass substrate using an appropriate method such as spin coating, roller coating, spray coating, and the like.

Subsequently, the substrate having the black photosensitive resin composition layer can be radiated by light to form a pattern required for a color filter. The radiation may be performed by using UV, an electron beam, or an X-ray as a light source, for example, UV in a range of about 190 nm to about 450 nm, and as another example about 200 nm to about 400 nm. The radiation may be performed by further using a photoresist mask. After performing the radiation process in this way, the black resin composition layer exposed to the light source can be treated with a developing solution. In addition, the image pattern acquired by the development can be cured through heat treatment, actinic ray radiation, or the like, which can improve crack resistance, solvent resistance, and the like.

Hereinafter, the present invention is illustrated in more detail with reference to the following examples. These examples, however, are not in any sense to be interpreted as limiting the scope of the invention.

EXAMPLE

Synthesis of Copolymerization Resin

Synthesis Example 1

Synthesis of Copolymerization Resin 1

86.6 g of N-methyl-2-pyrrolidone (NMP) is put in a four-necked flask equipped with a stirrer, a temperature controller, a nitrogen gas inlet, and a condenser while nitrogen is passed there, and 12.3 g of 4,4'-hexafluoroiso-propylidene)diphthalicanhydride (6-FDA) is added thereto to dissolve it. When a solid is completely dissolved, 3.25 g of 3-aminophenyl sulfone (3-DAS) is added thereto, and the mixture is stirred at room temperature for 2 hours. Then, the temperature is increased up to 90° C., 5.6 g of pyridine and 2.05 g of aceticanhydride ($A_2CO$) are added thereto, and the mixture is stirred for 3 hours. The temperature in the reactor is cooled down to room temperature, 1.6 g of 2-hydroxyethylmethacrylate (HEMA) is added thereto, and the mixture is stirred for 6 hours. Then, 3.25 g of 3-aminophenyl sulfone (3-DAS) is added thereto, and the mixture is reacted for 6 hours, completing a reaction. Subsequently, the reaction mixture is added to water, producing a precipitate, the precipitate is filtered and sufficiently cleaned with water, dried at 50° C. under vacuum for 24 hours, preparing a polyamide acid-polyimide copolymer (a copolymerization resin 1). The copolymer has a weight average molecular weight of 7,500 g/mol based on polystyrene in a GPC (Gel Permeation Chromatography) method and a polydispersity of 1.75. (A mole ratio of polyimide and polyamic acid units=50:50)

Synthesis Example 2

Synthesis of Copolymerization Resin 2

86.6 g of N-methyl-2-pyrrolidone (NMP) is put in a four-necked flask equipped with a stirrer, a temperature controller, a nitrogen gas inlet, and a condenser while nitrogen is passed there, 12.3 g of 4,4'-hexafluoroisopropylidene)diphthalicanhydride (6-FDA) is added thereto to dissolve it. When a solid is completely dissolved, 3.25 g of 4,4'-oxydianiline (ODA) is added thereto, and the mixture is stirred at room temperature for 2 hours. Then, the temperature is increased up to 90° C., 5.6 g of pyridine and 2.05 g of aceticanhydride ($A_2CO$) are added thereto, and the mixture is stirred for 3 hours. Subsequently, the temperature in the reactor is cooled down to room temperature again, 1.6 g of 2-hydroethylmethacrylate (HEMA) is added thereto, and the mixture is stirred for 6 hours. Then, 3.25 g of 4,4'-oxydianiline (ODA) is added thereto, and the mixture is reacted for 6 hours, completing a reaction. The resultant is added to water to produce a precipitate, the precipitate is filtered, sufficiently cleaned with water, and dried at 50° C. under vacuum for 24 hours, manufacturing a polyamide acid-polyimide copolymer (a copolymerization resin 2). The copolymer has a weight average molecular weight of 6,800 g/mol based on polystyrene in a GPC method and a polydispersity of 1.82. (a mole ratio of a polyimide unit and a polyamic acid unit=50:50)

Synthesis Example 3

Synthesis of Copolymerization Resin 3

86.6 g of N-methyl-2-pyrrolidone (NMP) is put in a four-necked flask equipped with a stirrer, a temperature controller, a nitrogen gas inlet, and a condenser while nitrogen is passed there, and 12.3 g of 4,4'-hexaflioroiso-propylidene)diphthalicanhydride (6-FDA) is added thereto and dissolved therein. When a solid is completely dissolved, 3.25 g of 4,4'-oxydianiline (ODA) is added thereto, and the mixture is stirred at room temperature for 2 hours. Then, the temperature is increased up to 90° C., 5.6 g of pyridine and 2.05 g of aceticanhydride ($A_2CO$) are added thereto, and the mixture is stirred for 3 hours. Subsequently, the temperature in the reactor is cooled down to room temperature, 1.6 g of 2-hydroethylmethacrylate (HEMA) is added thereto, and the mixture is stirred for 6 hours. Then, 3.25 g of 3-aminophenyl sulfone (3-DAS) is added thereto, and the obtained mixture is reacted for 6 hours, completing a reaction. The resultant is added to water to produce a precipitate, the precipitate is filtered, sufficiently cleaned with water, and dried at 50° C. under vacuum for 24 hours, manufacturing a polyamide acid-polyimide copolymer (a copolymerization resin 3). The copolymer has a weight average molecular weight of 7,200 g/mol based on polystyrene in a GPC method and a polydispersity of 1.80. (A mole ratio of a polyimide unit and a polyamic acid unit=50:50)

Synthesis Example 4

Synthesis of Copolymerization Resin 4

86.6 g of N-methyl-2-pyrrolidone (NMP) is put in a four-necked flask equipped with a stirrer, a temperature controller, a nitrogen gas inlet, and a condenser while nitrogen is passed there, and 12.3 g of 4,4'-hexafluoroisopropylidene)diphthalicanhydride (6-FDA) is added thereto to dissolve it. When a solid is completely dissolved, 2.6 g of 3-aminophenyl sulfone (3-DAS) is added thereto, and the mixture is stirred at room temperature for 2 hours. Then, a temperature is increased up to 90° C., 5.6 g of pyridine and 2.05 g of aceticanhydride ($A_2CO$) are added thereto, and the mixture is stirred for 3 hours. Subsequently, the temperature in the reactor is cooled down to room temperature, 1.6 g of 2-hydroethylmethacrylate (HEMA) is added thereto, and the mixture is stirred for 6 hours. Then, 3.9 g of 3-aminophenyl sulfone (3-DAS) is added thereto, and the mixture is reacted for 6 hours, completing a reaction. The resultant is added to water to produce a precipitate, and the precipitate is filtered, sufficiently cleaned with water, and dried at 50° C. under vacuum for 24 hours, manufacturing a polyamide acid-polyimide copolymer (a copolymerization resin 4). The copolymer has a weight average molecular weight of 6,700 g/mol based on polystyrene in a GPC method and a polydispersity of 1.73. (A mole ratio of a polyimide unit and a polyamic acid unit=40:60)

Comparative Synthesis Example 1

Synthesis of Resin 5

86.6 g of N-methyl-2-pyrrolidone (NMP) is put in a four-necked flask equipped with a stirrer, a temperature controller, a nitrogen gas inlet, and a condenser while nitrogen is passed there, and 12.3 g of 4,4'-hexaflioroiso-propylidene)diphthalicanhydride (6-FDA) is added thereto to dissolve it. When a solid is completely dissolved, 6.5 g of 3-aminophenyl sulfone (3-DAS) is added thereto, and the mixture is stirred at room temperature for 2 hours. Then, the temperature is increased up to 90° C., 11.2 g of pyridine and 4.05 g of aceticanhydride ($A_2CO$) are added thereto, and the resulting mixture is reacted for 3 hours, completing a reaction. The reaction resultant is added to water to produce a precipitate, the precipitate is filtered, sufficiently cleaned with water, and dried at 50° C. under vacuum for 24 hours, manufacturing a polyimide resin (a resin 5). The resin has a weight average molecular weight of 7,800 g/mol based on polystyrene in a GPC method and a polydispersity of 1.8.

Comparative Synthesis Example 2

Synthesis of Resin 6

86.6 g of N-methyl-2-pyrrolidone (NMP) is put in a four-necked flask equipped with a stirrer, a temperature controller, a nitrogen gas inlet, and a condenser while nitrogen is passed there, and 12.3 g of 4,4'-hexaflioroiso-propylidene)diphthalicanhydride (6-FDA) is added thereto to dissolve it. When a solid is completely dissolved, 6.5 g of 3-aminophenyl sulfone (3-DAS) is added thereto, and the mixture is stirred at room temperature for 2 hours, completing a reaction. The reaction resultant is added to water to produce a precipitate, and the precipitate is filtered, sufficiently cleaned with water, and dried at 50° C. under vacuum for 24 hours, manufacturing a polyamide acid resin (a resin 6). The resin has a weight average molecular weight of 7,500 g/mol based on polystyrene in a GPC method and a polydispersity of 2.1.

Comparative Synthesis Example 3

Synthesis of Resin Mixture 7

The resins 5 and 6 are mixed in a ratio of 1:1 parts by weight, preparing a polyimide and polyamic acid resin mixture (a resin mixture 7). The resin mixture has a weight average molecular weight of 7,600 g/mol based on polystyrene in a GPC method and a polydispersity of 1.95.

Preparation of Black Photosensitive Resin Composition

Example 1

12 g of the copolymerization resin 1 of Synthesis Example 1 is added to 43 g of a solvent (PGMEA) and dissolved therein, 8 g of a multi-functional monomer (DPHA; Japan Catalyst Co., Ltd.), 20 g of a black colorant (BK-6616 (Tokushiki Co., Ltd.):TCD-006H (Nippon Steel Corporation)=50:50 (w/w)), 2 g of a photopolymerization initiator (OXE01, BASF Co.), and 0.5 g of a surfactant (F-544; DIC Co., Ltd.) as an additive are added thereto and sufficiently dissolved therein. Then, the solution is filtered with a 0.45 μm fluorine resin filter, obtaining a black photosensitive resin composition.

Example 2

A black photosensitive resin composition is obtained according to the same method as Example 1 except for using the copolymerization resin 2 of Synthesis Example 2 instead of the copolymerization resin 1 of Synthesis Example 1.

Example 3

A black photosensitive resin composition is obtained according to the same method as Example 1 except for using the copolymerization resin 3 of Synthesis Example 3 instead of the copolymerization resin 1 of Synthesis Example 1.

Example 4

A black photosensitive resin composition is obtained according to the same method as Example 1 except for using the copolymerization resin 4 of Synthesis Example 4 instead of the copolymerization resin 1 of Synthesis Example 1.

Comparative Example 1

A black photosensitive resin composition is obtained according to the same method as Example 1 except for using a cardo-based binder resin (V259ME, Nippon Steel Corporation) instead of the copolymerization resin 1 of Synthesis Example 1.

Comparative Example 2

A black photosensitive resin composition is obtained according to the same method as Example 1 except for using the resin 5 of Comparative Synthesis Example 1 instead of the copolymerization resin 1 of Synthesis Example 1.

Comparative Example 3

A black photosensitive resin composition is obtained according to the same method as Example 1 except for using the resin 6 of Comparative Synthesis Example 2 instead of the copolymerization resin 1 of Synthesis Example 1.

Comparative Example 4

A black photosensitive resin composition is obtained according to the same method as Example 1 except for using the resin mixture 7 of Comparative Synthesis Example 3 instead of the copolymerization resin 1 of Synthesis Example 1.

Table 1 provides the compositions of each component used to prepare the black photosensitive resin compositions.

TABLE 1

(unit: parts by weight)

| | | Example 1 | Example 2 | Example 3 | Example 4 | Comparative Example 1 | Comparative Example 2 | Comparative Example 3 | Comparative Example 4 |
|---|---|---|---|---|---|---|---|---|---|
| Alkali soluble resin | copolymerization resin 1 | 60 | — | — | — | — | — | — | — |
| | copolymerization resin 2 | — | 60 | — | — | — | — | — | — |
| | copolymerization resin 3 | — | — | 60 | — | — | — | — | — |
| | copolymerization resin 4 | — | — | — | 60 | — | — | — | — |
| | cardo-based resin | — | — | — | — | 60 | — | — | — |
| | resin 5 | — | — | — | — | — | 60 | — | — |
| | resin 6 | — | — | — | — | — | — | 60 | — |
| | resin mixture 7 | — | — | — | — | — | — | — | 60 |
| Multi-functional monomer | | 40 | 40 | 40 | 40 | 40 | 40 | 40 | 40 |
| Photopolymerization initiator | | 10 | 10 | 10 | 10 | 10 | 10 | 10 | 10 |

TABLE 1-continued (unit: parts by weight)

|  | Example 1 | Example 2 | Example 3 | Example 4 | Comparative Example 1 | Comparative Example 2 | Comparative Example 3 | Comparative Example 4 |
|---|---|---|---|---|---|---|---|---|
| Black colorant | 100 | 100 | 100 | 100 | 100 | 100 | 100 | 100 |
| Solvent | 215 | 215 | 215 | 215 | 215 | 215 | 215 | 215 |
| Other additive (surfactant) | 2.5 | 2.5 | 2.5 | 2.5 | 2.5 | 2.5 | 2.5 | 2.5 |

Evaluation (Formation of Photosensitive Resin Layer Pattern)

Each black photosensitive resin composition according to Examples 1 to 4 and Comparative Examples 1 to 4 is used to form a cured layer pattern in the following method.

The black photosensitive resin composition is coated at 300 rpm on a glass substrate having a clean surface by using a spin coater, K-SPINNER made by SEMES to form a resin coating layer. After the coating, the coating layer is dried to be 1.5 μm thick on a 100° C. hot plate for 100 seconds. Subsequently, the dried layer is exposed within an energy dose of 100 mJ/cm$^2$ through a mask (a gap of 100 μm) by radiating an actinic ray energy ray such as ultraviolet (UV) and the like. The exposed layer is developed by using a developing solution (a 0.043% KOH aqueous solution, 23° C., 120 seconds), forming the cured layer pattern. After the development, the layer is post-baked in a 350° C. convection oven.

(Development-Starting Time)

The development-starting time indicates when the compositions are developed and started to form a pattern by prebaking and exposing the black photosensitive resin composition of Examples 1 to 4 and Comparative Examples 1 to 4 after coating them on a glass substrate and then, examining the pattern formation with naked eyes.

(Dissolution Rate (DR))

The black photosensitive resin compositions according to Examples 1 to 4 and Comparative Examples 1 to 4 are respectively coated on a 4-inch wafer and then, pre-baked. The samples are cut into a size of 2 cm×2 cm and put in a 0.043% KOH solution at 23° C., and their dissolution speeds are examined.

(Measurement of Heat Resistance)

The obtained photosensitive resin layer is used for a TGA analysis, obtaining a 1 wt % loss temp. The 1 wt % loss temp. indicates a temperature that 1 wt % of each sample is reduced based on the entire weight.

(Tapered Angle (°))

The black photosensitive resin compositions according to Examples 1 to 4 and Comparative Examples 1 to 4 are coated and then pre-baked and exposed. The exposure is performed by using an i-line exposer (i10c) and realized a 5 μm isolated line pattern. Then, the pattern is cured at 350° C. for 1 hour in the convection oven and then measured with S-4300 FE-SEM equipment made by Hitachi Ltd.

The development-starting time, dissolution rate (DR), 1 wt % loss temp., and tapered angle results are provided in Table 2.

TABLE 2

|  | Development starting time (sec) | 1 wt % loss temp. (° C.) | Tapered angle (°) | DR (A/s) |
|---|---|---|---|---|
| Example 1 | 55 | 375 | 70 | 200 |
| Example 2 | 65 | 368 | 70 | 210 |
| Example 3 | 75 | 381 | 65 | 170 |
| Example 4 | 35 | 373 | 55 | 350 |
| Comparative Example 1 | 40 | 250 | 50 | 170 |
| Comparative Example 2 | Pattern was not formed | 390 | — | 0 |
| Comparative Example 3 | Pattern was not formed | 385 | — | 25000 |
| Comparative Example 4 | 110 | 380 | — (Scum) | 100 |

Referring to Table 2, a black photosensitive resin composition including an alkali soluble polyimide-polyamic acid copolymerization resin maintains a similar dissolution rate but shows excellent heat resistance and tapered angle characteristics compared with a black photosensitive resin composition including no alkali soluble resin. In particular, when a polyimide resin is used as the alkali soluble resin as shown in Comparative Example 2, a layer formed of the composition is not developed and forms no pattern. On the other hand, when a polyamic acid resin is used as the alkali soluble resin as shown in Comparative Example 3, both of exposed region/non-exposed region are all developed due to a fast development speed, and a pattern is not formed. In addition, when a mixture of the polyimide resin and the polyamic acid resin is used as shown in Comparative Example 4, developability is deteriorated compared with a copolymer, and a scum is produced during formation of a pattern.

Many modifications and other embodiments of the invention will come to mind to one skilled in the art to which this invention pertains having the benefit of the teachings presented in the foregoing description. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A black photosensitive resin composition comprising:

(A) an alkali soluble polyimide-polyamic acid copolymerization resin;

(B) a multi-functional monomer;

(C) a photopolymerization initiator;

(D) a black colorant; and (E) a solvent, wherein the copolymerization resin has a unsaturated double bond at at least one terminal end, and

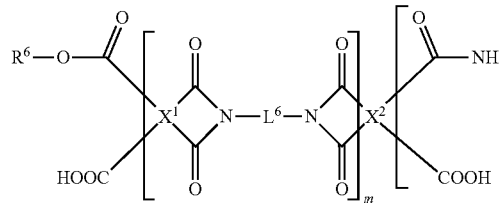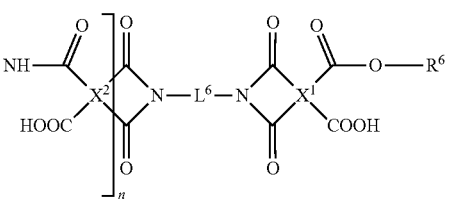

wherein the unsaturated double bond is derived from a compound of Chemical Formula 1 to Chemical Formula 4, or a combination thereof:

[Chemical Formula 1]

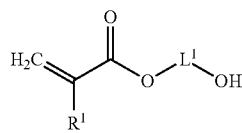

[Chemical Formula 2]

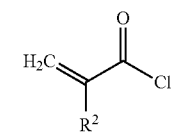

[Chemical Formula 3]

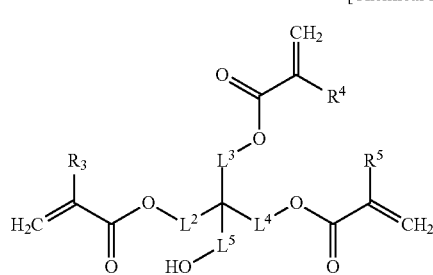

[Chemical Formula 4]

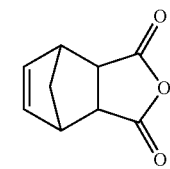

wherein, in Chemical Formula 1 to Chemical Formula 3,
$R^1$ to $R^5$ are the same or different and are each independently a hydrogen atom or a substituted or unsubstituted C1 to C10 alkyl group, and $L^1$ to $L^5$ are the same or different and are each independently a single bond or a substituted or unsubstituted C1 to C10 alkylene group.

2. The black photosensitive resin composition of claim 1, wherein the copolymerization resin comprises polyimide and polyamic acid in a mole ratio of about 1:99 to about 95:5.

3. The black photosensitive resin composition of claim 1, wherein the copolymerization resin comprises polyimide and polyamic acid in a mole ratio of about 40:60 to about 60:40.

4. The black photosensitive resin composition of claim 1, wherein copolymerization resin is represented by Chemical Formula 5:

wherein, in Chemical Formula 5,
$X^1$ and $X^2$ are the same or different and are each independently a substituted or unsubstituted tetravalent alicyclic organic group or a substituted or unsubstituted tetravalent aromatic organic group, $L^6$ and $L^7$ are the same or different and are each independently a single bond, a substituted or unsubstituted C1 to C10 alkylene group, a substituted or unsubstituted C3 to C10 cycloalkylene group, or a substituted or unsubstituted C6 to C20 arylene group, each $R^6$ is the same or different and each is independently a substituted or unsubstituted acrylic group, a substituted or unsubstituted methacrylic group or a substituted or unsubstituted norbornene group, and m and n are the same or different and are each independently an integer ranging from 1 to 100,000.

5. The black photosensitive resin composition of claim 1, wherein the copolymerization resin has a weight average molecular weight of about 3,000 g/mol to about 100,000 g/mol.

6. The black photosensitive resin composition of claim 1, wherein the copolymerization resin is mixed with another alkali soluble resin comprising a novolac resin, a bisphenol A resin, a bisphenol F resin, an acryl-based resin, a silanol group-containing resin, a silsesquioxane-containing resin, or a combination thereof.

7. The black photosensitive resin composition of claim 1, wherein the black colorant comprises an aniline black pigment, a perylene black pigment, a titanium black pigment, a cyanine black pigment, a lignin black pigment, a lactam-based organic black pigment, a RGB black pigment, a carbon black pigment, a black dye, or a combination thereof.

8. The black photosensitive resin composition of claim 1, wherein the black photosensitive resin composition further comprises a photosensitizer.

9. The black photosensitive resin composition of claim 1, wherein the black photosensitive resin composition comprises about 1 parts by weight to about 100 parts by weight of (B) the multi-functional monomer, about 0.1 parts by weight to about 100 parts by weight of (C) the photopolymerization initiator, about 10 parts by weight to about 400 parts by weight of (D) the black colorant and about 100 parts by weight to about 5000 parts by weight of (E) the solvent, each based on about 100 parts by weight of the (A) copolymerization resin.

10. The black photosensitive resin composition of claim 1, wherein the black photosensitive resin composition further comprises malonic acid, 3-amino-1,2-propanediol, a silane-based coupling agent, a leveling agent, a fluorine-based surfactant, a radical polymerization initiator, or a combination thereof.

11. A photosensitive resin layer manufactured using the black photosensitive resin composition of claim 1.

12. A display device comprising the photosensitive resin layer of claim 11.

* * * * *